United States Patent [19]

Brajder

[11] Patent Number: 4,525,765
[45] Date of Patent: * Jun. 25, 1985

[54] PROTECTIVE CIRCUIT FOR A SWITCHING TRANSISTOR

[75] Inventor: Antonio Brajder, Erlangen, Fed. Rep. of Germany

[73] Assignee: Siemens Aktiengesellschaft, Berlin and Munich, Fed. Rep. of Germany

[*] Notice: The portion of the term of this patent subsequent to Dec. 27, 2000 has been disclaimed.

[21] Appl. No.: 482,471

[22] Filed: Apr. 6, 1983

[30] Foreign Application Priority Data

May 5, 1982 [DE] Fed. Rep. of Germany ....... 3216833

[51] Int. Cl.³ .................................. H02H 3/26
[52] U.S. Cl. ........................... 361/88; 361/86; 361/98; 361/89; 330/207 P
[58] Field of Search ............... 361/56, 86, 88, 91, 361/89, 111, 98; 330/207 P, 298; 323/276, 279

[56] References Cited

U.S. PATENT DOCUMENTS

| | | | |
|---|---|---|---|
| 3,600,695 | 8/1971 | Krausser | 330/298 X |
| 3,801,894 | 4/1974 | Spiegel | 361/86 X |
| 3,840,820 | 10/1974 | Kawada | 361/88 X |
| 3,904,979 | 9/1975 | Suzuki | 330/298 |
| 4,374,364 | 2/1983 | Hemery et al. | 330/298 |
| 4,423,457 | 12/1983 | Brajder | 361/86 |

FOREIGN PATENT DOCUMENTS 2555509 6/1977 Fed. Rep. of Germany .

OTHER PUBLICATIONS

Elektronik, 1980, No. 25, pp. 46 & 47.
IBM Technical Disclosure Bulletin, vol. 18, No. 10, 3/76, pp. 3236 and 3237.

Primary Examiner—Patrick R. Salce
Attorney, Agent, or Firm—Kenyon & Kenyon

[57] ABSTRACT

A protective circuit for a switching transistor is disclosed in which the base-emitter voltage of the switching transistor is compared in a comparator with a reference voltage. If the collector current of the switching transistor increases, the base-emitter voltage also increases, with the base current remaining constant. As soon as the base-emitter voltage exceeds the reference voltage, a signal is delivered at the output of the comparator. A switching-off device for switching off the driving pulses of the switching transistor responds to this signal so that a switching-on pulse present at the base of the switching transistor is switched off. The reference voltage is fixed so that the switching transistor is protected against overload by excessively large collector currents.

5 Claims, 6 Drawing Figures

PROTECTIVE CIRCUIT FOR A SWITCHING TRANSISTOR

BACKGROUND OF THE INVENTION

The present invention relates to a protective circuit for a switching transistor having a switching-off device for the driving pulses of the switching transistor, wherein the switching-off device is addressed by a comparator which compares a voltage at the switching transistor with a reference voltage and switches off the driving pulses if the switching transistor is overloaded.

Such a protective circuit is known from the journal "Elektronik", 1980, No. 25, pages 46 and 47. With such a protective circuit, the switching transistor is monitored for desaturation, i.e., it is checked to determine if its collector-emitter voltage exceeds the value occurring if the transistor is saturated. The switching transistor can thereby be protected against short circuits and overloads. In the known circuit, the collector-emitter voltage of the switching transistor is therefore compared in a comparator with a reference voltage corresponding to the saturation value and the driving pulses are switched off if the collector-emitter voltage of the switching transistor exceeds the saturation value.

The following problem, however, arises with this known circuit: the collector-emitter voltage drops relatively slowly when the switching transistor is switched on and reaches the low steady-state value only after a certain delay time. In order to prevent the protective circuit from responding during the delay time, the former must have a corresponding delay. Since this delay is effective also when switching in the presence of an existing short circuit, the short circuit current can build up unimpeded during the delay time. If the switching transistor is operating with a large base current or if a high-gain Darlington stage is involved, the short circuit current often reaches values which are permissible for at least only a limited number of short circuit switching processes during the operating time of the switching transistor.

It is therefore an object of the present invention to develop a protective circuit of the type mentioned above without or with only a very small response delay.

SUMMARY OF THE INVENTION

This and other objects of the present invention are achieved in a protective circuit for a switching transistor having switching-off means for switching-off the driving pulses of the switching transistor, wherein the switching-off means is activated by comparator means which compares a voltage from the switching transistor at a first input with a reference voltage at a reference input and which switches off the driving pulses if the switching transistor is overloaded, the improvement comprising the first input of the comparator means being coupled to the base of the switching transistor and comparing the base-emitter voltage of the switching transistor with the reference voltage, the comparator means generating a signal for activating the switching-off means when the base-emitter voltage is outside a normal operating range determined by said reference voltage.

Therefore, the rise of the base-emitter voltage and not, as in the known arrangement, the rise of the collector-emitter voltage of the switching transistor is utilized as the switching-off criterion in the event of a short circuit. In switching transistors, in addition to the collector-emitter voltage, the base-emitter voltage also increases with increasing collector current for constant base current. In normal operation without a short circuit, the base emitter voltage reaches its steady-state value almost immediately when a switching-on pulse is applied, i.e., it does not have an increased value, like the collector emitter voltage, at the beginning of the switching-on phase. In the protective circuit according to the invention, therefore, no response delay or a very small response delay which is due to the conduction behavior of the base-emitter path is needed. Since a rise of the base-emitter voltage follows a rise of the collector current almost without delay, i.e., the short-circuit current is determined almost without delay, very fast switching-off action is achieved with the protective circuit according to the invention in the event of a short circuit. The short-circuit current can therefore be limited for a high rate of rise to values which are permissible also for periodic overcurrent operation. With the invented protective circuit, no conditions must be met with respect to a minimum switching-on or -off time, which was necessary in the known arrangement because of the charging of a capacitor in the response delay stage. In addition, instead of the collector voltage which can assume very high values, the lower base voltage which can therefore be processed more easily by the monitoring circuitry is measured in the protective circuit according to the invention.

A particularly simple realization of the protective circuit is obtained if the comparator means is a Zener diode with the Zener voltage as a reference voltage which is connected at one end to the base of the switching transistor, and at the other end to the base of the switching-off transistor. With this arrangement a complete disconnection of the switching transistor is not obtained in the event of a short circuit but only a limitation of the current through the switching transistor to permissible values. A complete disconnection can be accomplished by a superimposed unit, for instance, a control arrangement.

The switching transistor is disconnected completely by the protective circuit if a memory is connected between the comparator and the switching-off device. For resetting this memory, the driving pulses can be fed to a clock edge-controlled reset input of the memory. The switching-off is thereby cancelled with the disappearance of the driving pulse causing a short-circuit current, or with the appearance of a new driving pulse.

Instead of connecting a separate memory in series with the switching-off device, the comparator may also have a feedback diode for obtaining a storage effect between its output and its input. If the comparator has responded once, it therefore remains in the addressed condition until it is reset.

The comparator with storage action can be reset by feeding the driving pulses via a diode and a capacitor shunted by a resistor to the one input of the comparator so that an edge of the driving pulse resets the comparator.

In a protective circuit, in which the collector-emitter path of the switching transistor is bridged by a series circuit comprising a diode and a capacitor, wherein the driving pulses are fed via a resistor to the junction point of the diode and capacitor and wherein the junction point of the diode and capacitor is connected to a reference input of the comparator, the junction point and the base of the switching transistor may be connected via decoupling diodes to the same reference input of the comparator. In this protective circuit, the base-emitter voltage as well as the collector-emitter voltage of the switching transistor are thus monitored. If only the base-emitter voltage is monitored, a short circuit is detected but not every case of overloading. For example, an overload of the switching transistor can be caused by not only by a current rise in the load circuit but, also, for instance, by a voltage across the collector-emitter path of the switching transistor caused by too small a base current. If the monitoring of the base-emitter voltage is combined with the monitoring of the collector-emitter voltage, very fast-acting protection is obtained with the base voltage monitoring in the event of a short circuit, and combined with the monitoring of the emitter-collector voltage, a reliable protection for nearly all conceivable cases of overloading is provided.

A feedback capacitor may be arranged between the output and a reference input driven by the reference voltage of the comparator. In a comparator interconnected in this manner, a turn-off command remains stored for a certain minimum time. After the expiration of this minimum time, an additional collector-emitter voltage monitoring device, for instance, can switch off the switching transistor definitely.

BRIEF DESCRIPTION OF THE DRAWINGS

The invention will be described in greater detail below in the following detailed description with reference to the drawings, in which.

DETAILED DESCRIPTION

Figure 1:
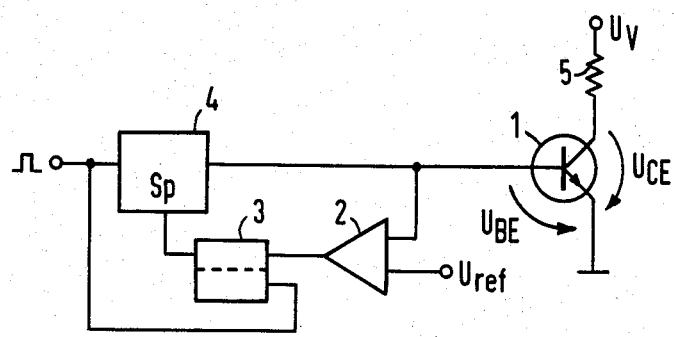
FIG. 1 is a schematic/block diagram of the protective circuit for a switching transistor according to the invention.

With reference now to the drawings, FIG. 1 shows a schematic/block diagram of the protective circuit according to the invention. A load 5 is connected to a supply voltage source $U_v$ in series with a switching transistor 1. If the load 5 is short-circuited or has too small a resistance, this could lead to an unpermissibly large current through the transistor 1 and therefore to its destruction. The protective circuit according to the invention described herein is provided to prevent this. This protective circuit can likewise be used if a Darlington transistor arrangement is provided instead of the switching transistor 1.

To the base of the transistor 1, driving pulses are fed via a symbolically shown switching-off device 4, by which switching-on pulses for the switching transistor 1 can be interrupted or shorted in case of a disturbance. This switching-off device is addressed by a comparator 2 which compares the base-emitter voltage $U_{BE}$ with a reference voltage $U_{ref}$. The comparator is followed by a storage device 3 which stores a switching-off signal delivered by the output of the comparator 2. The output of the storage device 3 is connected to a blocking input Sp of the switching-off device 4. In the embodiment shown in FIG. 1, the driving pulses for the switching transistor 1 are also fed to a reset input of the storage device 3.

Figure 3:
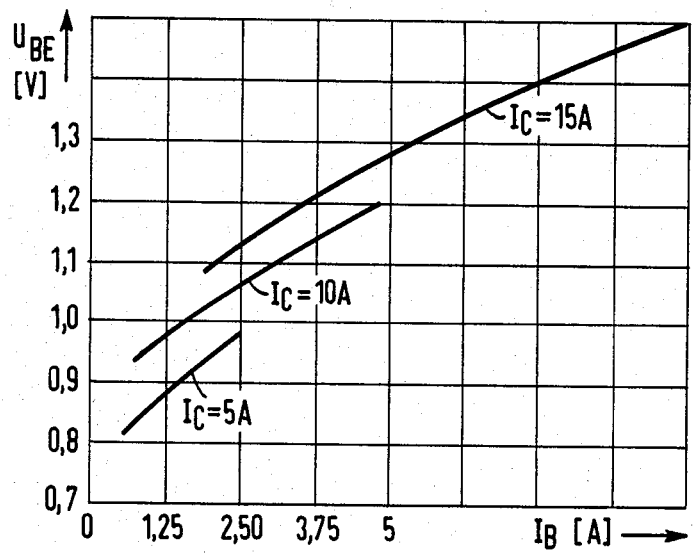
FIG. 3 is a graph of switching transistor base to emitter voltage versus base current for varying collector currents.
Figure 2:
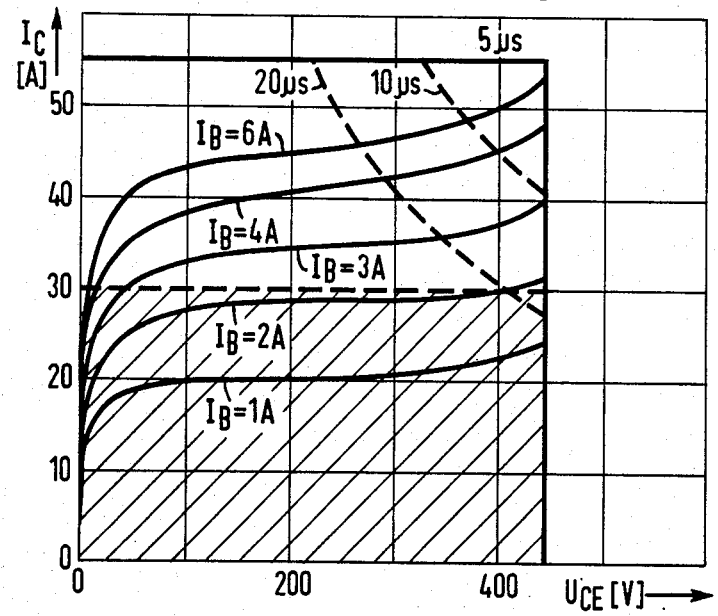
FIG. 2 is a graph of switching transistor collector current versus collector to emitter voltage for various constant base currents.

The operation of this arrangement will be explained in the following in greater detail, making reference to the diagrams shown in FIGS. 2 and 3. FIG. 2 shows the dependence of the collector current $I_C$ on the collector-emitter voltage $U_{CE}$ for different constant base currents $I_B$.

The region permissible for pairs of values $I_C$, $U_{CE}$ is shown framed by a box. Within the permissible regions, the shaded region which can be utilized periodically and the non-shaded region which can be reached only for a limited number N of switching actions, for instance, N<3000, must be distinguished. Furthermore, regions for different permissible "on" time, for instance, 20 or 10 us are delineated. It is an object of the protective circuit to see to it that the transistor 1 does not leave the permitted operating range and as far as possible, remains in the shaded operating region. If therefore with the switching transistor 1 switched on, the collector current $I_C$ rises, for instance, due to a short circuit of the load 5, the switching transistor 1 must be switched off before the collector current $I_C$ exceeds the maximum collector urrent $I_C$ related to the respective collector-emitter voltage $U_{CE}$ and the set base current $I_B$.

In the protective circuit according to the invention, the rise of the base-emitter voltage $U_{BE}$ is used as a criterion for such a disturbance. This is because, as a typical $I_B/U_{BE}$ diagram according to FIG. 3 shows, the base-emitter voltage $U_{BE}$ also rises with increasing collector current $I_C$, with the base current $I_C$ constant. While this rise is not proportional to the rise of the collector current $I_C$, it is nevertheless significant enough to detect in the case of a short circuit.

The reference voltage $U_{ref}$ will therefore be chosen in the circuit according to FIG. 1 so that, with a fixed base current $I_B$, the base-emitter voltage $U_{BE}$ always remains below the reference voltage $U_{ref}$ but, in the event of a short circuit, exceeds this reference voltage $U_{ref}$ and thereby leads to the disappearance of a switching-on pulse present at the switching transistor 1 via the switching-off device 4. Since the base-emitter path conducts an impressed base current almost without delay, and therefore almost no dynamic overshoot of the base-emitter voltage $U_{BE}$ occurs when the base current $I_B$ is switched on, the switching-on can in general be accomplished without delay. A small delay which might be necessary could be accomplished with a small time constant by an R-C stage, not shown in FIG. 1. Since the base-emitter voltage $U_{BE}$ follows the collector current $I_C$ practically without delay, one therefore obtains in the case of a short circuit a very fast shut-off of the switching transistor 1, so that for very high rates of rise of the short circuit current, the shaded operating range of the switching transistor permitted for periodic processes is not exceeded.

Figure 4:
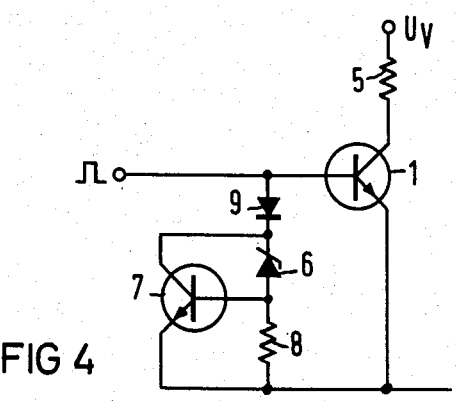
FIG. 4 is a circuit diagram of a further embodiment of the protective circuit.

A particularly simple embodiment of the protective circuit is shown in FIG. 4. In FIG. 4, the comparator is realized by a Zener diode 6, the Zener voltage of which corresponds to the reference voltage $U_{ref}$ of FIG. 1. The cathode of this Zener diode is coupled via an oppositely polarized diode 9 to the base of the switching transistor 1, and the anode of the Zener diode 6 is connected via a resistor 8 to the emitter of the switching transistor 1. A switching-off transistor 7 is provided as a switching-off device, the collector of which is connected to the cathode of the Zener diode 6, the emitter of which is connected to the emitter of the switching transistor 1, and the base of which is connected to the anode of the Zener diode 6. If in this arrangement the base-emitter voltage $U_{BE}$ of the switching transistor 1, which is to be monitored, exceeds the Zener voltage of the Zener diode, the latter becomes conducting and causes a voltage drop across the resistor 8. This voltage drop causes the switching-off transistor 7 to become conducting, and the base current of the switching transistor 1 is conducted through the transistor 7 via the diode 9. The base-emitter voltage of the switching transistor 1 is thereby limited to a value which is equal to the threshold value of the diode 9 plus the Zener voltage of the Zener diode 6 wnd the small base-emitter voltage of switching off transistor 7. Due to the relationship shown in FIG. 3, the collector current is also therefore limited to a permissible value. While no complete shut-off of the switching transistor 1 occurs, the latter remains in the permissible operating range.

Figure 5:
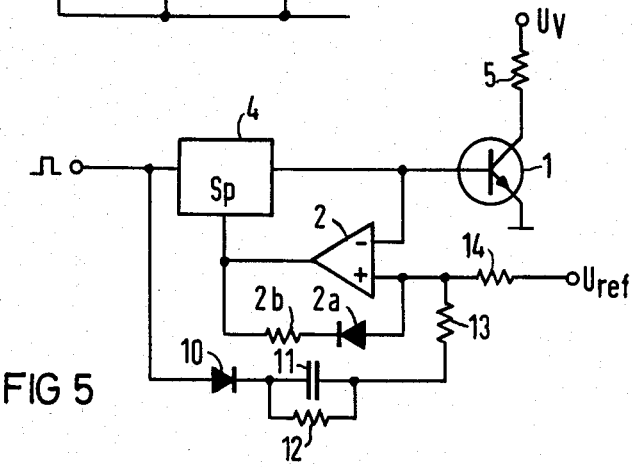
FIG. 5 is a schematic/block diagram of yet a further embodiment of the protective circuit.

A further embodiment is shown in FIG. 5. This embodiment corresponding substantially to the circuit shown in FIG. 1, although no separate memory 3 is provided, the comparator 2 itself having a storage function. This is achieved by inserting between the positive input and the output of the comparator 2, the series circuit comprising diode 2a and resistor 2b. At the negative input of the comparator 2 the base-emitter voltage of the switching transistor 1 is present and the reference voltage $U_{ref}$ is coupled to the plus input of the comparator 2 via a resistor 14. As long as the base-emitter voltage $U_{BE}$ is below the reference voltage $U_{ref}$, the output voltage of the comparator 2 is positive and the feedback branch is blocked by the diode 2a. If on the other hand the base-emitter voltage of the switching transistor is larger than the reference voltage $U_{ref}$, the output voltage of the comparator 2 becomes negative and causes the switching-off device 4 to shut off the present switching-on pulse. In addition, the negative voltage is fed back via the resistor 2b and the diode 2a to the positive input of the comparator 2 so that the negative output voltage of the comparator 2 is maintained even if the base-emitter voltage of the switching transistor 1 goes to zero after the switching-off device has responded. In order to reset the memory realized by the comparator 2, the driving pulses are also fed to its positive input via the series circuit comprising diode 10, capacitor 11 shunted by resistor 12 and resistor 13. If the short circuit is removed, i.e., a voltage is no longer present at the negative input of the comparator 2, a positive pulse is transmitted with the next positive edge of a driving pulse via the series circuit mentioned to the positive input of the comparator 2 which is still negative because of the feedback by the resistor 2b and the diode 2a. This input therefore becomes briefly positive, so that the self-latching is cancelled and the blocking signal for the switching-off device is removed.

Figure 6:
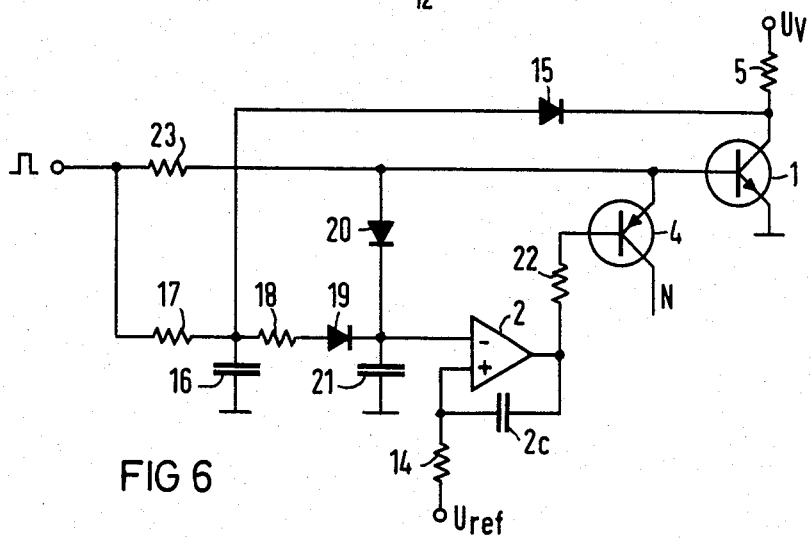
FIG. 6 is a circuit diagram of still a further embodiment of the protective circuit.

A further embodiment of the invention is shown in FIG. 6. In FIG. 6, the base-emitter path of the switching transistor 1 is shunted by a series circuit comprising diode 20 and capacitor 21. The junction point of the diode 20 and the capacitor 21 is connected to the negative input of the comparator 2. The output of the comparator 2 is connected via a resistor 22 to the base of a switching-off transistor 4 which serves as the switching-off device, the collector-emitter path of which is connected parallel to the collector-emitter path of the switching transistor 1. The reference voltage $U_{ref}$ is fed to the positive input of the comparator 2 via a resistor 14. In a feedback branch between the output of the comparator 2 and its positive input, a capacitor 2c is disposed. So far as heretofore described, the circuit shown in FIG. 6 operates like the circuit shown in FIG. 1; a short response delay for the switching-off device is realized by the capacitor 21. Self-latching of the comparator 2 is achieved by the feedback capacitor 2c for a time which is determined by the time constant of the R-C stage comprising the feedback capacitor 2c and the resistor 14. A minimum switching-off time, which may be, for instance, about 5 to 10 microseconds is thus obtained when the protective device responds.

Since, as already explained, substantially only short circuits can be determined by monitoring the base-emitter voltage of the switching transistor 1, a second switching-off device which responds to the rise of the collector-emitter voltage is provided in the protective circuit shown in FIG. 6. To this end, the series circuit of a diode 15 and a capacitor 16 is connected between the collector and the emitter of the switching transistor 1, the cathode of the diode 15 being connected to the collector of the switching transistor 1. The driving pulses are fed to the junction point of the diode 15 and the capacitor 16 via a resistor 17. In addition, this junction point is connected to the negative input of the comparator 2 via a resistor 18 and a diode 19.

If a switching-on pulse occurs in this circuit arrangement, the capacitor 16 is charged via the resistor 17. In normal operation, however, the voltage at the capacitor 16 does not reach a value sufficient to drive the comparator 2 because, after a certain delay following the occurrence of the switching-on pulse, the switching transistor 1 becomes conducting and the capacitor 16 is discharged via the diode 15 and the switching transistor 1 to the collector-emitter voltage of the switching transistor 1. In order to ensure that a switching-on pulse does not lead to a response of the comparator 2 in normal operation, the time constant of the R-C stage comprising resistor 17 and capacitor 16 must therefore be long as compared to the switching-on time of the switching transistor 1. If instead the collector-emitter voltage of the switching transistor 1 rises due to a disturbance, for instance, due to too low a base current for the switching transistor 1, the capacitor 16 is charged via the resistor 17 to a corresponding voltage until finally the comparator 2 is driven via the resistor 18 and the decoupling diode 19 and shuts off the switching transistor 1 by the switching-off transistor 4. This switching-off operation is, however, likewise delayed by the R-C stage comprising capacitor 16 and resistor 17 required for the switching-on process. Since the collector-emitter voltage continues to rise when the switching transistor 1 is shut off and initially, a switching-on pulse is still present at the resistor 17, the capacitor 16 remains charged to a high voltage. The switching transistor 1 thereby remains shut off until the switching-on pulse disappears and the capacitor 16 is discharged via the resistor 17. As far as the described collector-emitter voltage monitoring is concerned, this circuit arrangement therefore has self-latching behavior which is cancelled again by the disappearance of the switching-on pulse.

In the circuit arrangement described, the switching transistor 1 is therefore switched off very quickly by the base-emitter voltage monitoring. The minimum switching-off time fixed by the capacitor 2c is designed so that after its expiration, the comparator 2 remains addressed by the collector-emitter voltage monitoring device via the capacitor 16, until the present switching-on pulse has disappeared. In the case of an overload which cannot be detected reliably by the base-emitter voltage monitoring device, the switching transistor 1 is shut off directly by monitoring the collector-emitter voltage. While such a switching-off action takes place, contrary to the short-circuit case, only after certain delay, the time delay is less critical here because the currents to be taken into consideration are smaller than in the case of a short circuit. If the overload case occurs only during the "on" phase of switching transistor 1, the capacitor 16 is already precharged, so that the response time is substantially shorter still.

In the foregoing specification, the invention has been described with reference to specific exemplary embodiments thereof. It will, however, be evident that various modifications and changes may be made thereunto without departing from the broader spirit and scope of the invention as set forth in the appended claims. The specification and drawings are, accordingly, to be regarded in an illustrative rather than in a restrictive sense.

What is claimed is:

1. In a protective circuit for a switching transistor having switching-off means for switching off the driving pulses of the switching transistor, wherein the switching-off means is activated by comparator means which compares a voltage from the switching transistor at a first input with a reference voltage at a reference input and which switches off the driving pulses if the switching transistor is overloaded, the improvement comprising said first input of said comparator means being coupled to the base of the switching transistor and comparing the base-emitter voltage of the switching transistor with the reference voltage, said comparator means generating a signal at an output thereof for activating the switching-off means when the base-emitter voltage is outside a normal operating range determined by said reference voltage, memory means coupled between the output of said comparator means and a blocking input of said switching-off means for maintaining said switching-off means in a state whereby said switching transistor is switched off when said switching transistor becomes overloaded, said memory means including a reset input for deactivating said switching-off means, said reset input activated by said driving pulses.

2. In a protective circuit for a switching transistor having switching-off means for switching off the driving pulses of the switching transistor, wherein the switching-off means is activated by comparator means which compares a voltage from the switching transistor at a first input with a reference voltage at a reference input and which switches off the driving pulses if the switching transistor is overloaded, the improvement comprising said first input of said comparator means being coupled to the base of the switching transistor and comparing the base-emitter voltage of the switching transistor with the reference voltage, said comparator means generating a signal for activating the switching-off means when the base-emitter voltage is outside a normal operating range determined by said reference voltage, said comparator means having a memory means including a feedback diode coupled between the output and an input thereof for maintaining said switching-off means in a state whereby said switching transistor remains switched off when said switching transistor is overloaded.

3. The improvement recited in claim 2, further comprising circuit means including a diode is series with a capacitor, said capacitor shunted by a resistor, said driving pulses being coupled to one input of said comparator means by said circuit means so that an edge of a driving pulse resets said comparator means so that said switching-off means allows said switching transistor to be switched on by said driving pulses.

4. In a protective circuit for a switching transistor having switching-off means for switching off the driving pulses of the switching transistor, wherein the switching-off means is activated by comparator means which compares a voltage from the switching transistor at a first input with a reference voltage at a reference input and which switches off the driving pulses if the switching transistor is overloaded, the improvement comprising said first input of said comparator means being coupled to the base of the switching transistor and comparing the base-emitter voltage of the switching transistor with the reference voltage, said comparator means generating a signal at the output thereof for activating the switching-off means when the base-emitter voltage is outside a normal operating range determined by said reference voltage, the collector-emitter path of the switching transistor being shunted by a series circuit comprising a diode and a capacitor;

said driving pulses being fed by a resistor to the junction point of said diode and said capacitor; and the junction point of said diode and said capacitor being coupled to said first input of said comparator means, said junction point and the base of the switching transistor being coupled by respective decoupling diodes to said first input of said comparator means.

5. The improvement recited in claim 4, further comprising a feedback capacitor disposed between the output of said comparator means and said reference input.

* * * * *